(12) United States Patent
Hurwitz et al.

(10) Patent No.: US 6,262,478 B1
(45) Date of Patent: Jul. 17, 2001

(54) ELECTRONIC INTERCONNECT STRUCTURE AND METHOD FOR MANUFACTURING IT

(75) Inventors: Dror Hurwitz, Gilboa; Eva Igner; Boris Yofis, both of Haifa; Dror Katz, Kiryat Tivon, all of (IL)

(73) Assignee: Amitec-Advanced Multilayer Interconnect Technologies Ltd., Migdal Hemek (IL)

( * ) Notice: Subject to any disclaimer, the term of this patent is extended or adjusted under 35 U.S.C. 154(b) by 0 days.

(21) Appl. No.: 09/310,328

(22) Filed: May 12, 1999

Related U.S. Application Data

(62) Division of application No. 08/835,514, filed on Apr. 8, 1997, now Pat. No. 5,946,600.

(51) Int. Cl.[7] .................................................. H01L 23/053

(52) U.S. Cl. ......................... 257/700; 257/748; 257/750

(58) Field of Search .................................... 257/750, 748, 257/751, 752, 753, 736, 758, 759, 763, 764, 765, 700; 438/652, 653, 654, 656

(56) References Cited

U.S. PATENT DOCUMENTS

| | | | |
|---|---|---|---|
| 4,087,314 | * 5/1978 | George et al. ...................... 156/643 |
| 4,221,047 | * 9/1980 | Narken ................................. 29/840 |
| 4,791,463 | * 12/1988 | Malhi .................................. 357/23.6 |
| 4,884,123 | * 11/1989 | Dixit et al. .............................. 357/71 |
| 4,914,739 | * 4/1990 | Malhi .................................. 357/23.6 |
| 4,960,732 | * 10/1990 | Dixit et al. ............................ 438/628 |
| 5,177,176 | * 1/1993 | Auman ................................. 528/188 |
| 5,196,103 | * 3/1993 | Tou et al. ......................... 204/192.34 |
| 5,340,370 | * 8/1994 | Cadien et al. .......................... 51/308 |
| 5,485,038 | * 1/1996 | Licari ................................. 257/758 |
| 5,504,043 | * 4/1996 | Ngan et al. ........................... 438/655 |
| 5,599,582 | * 2/1997 | Adamopoulos et al. ......... 427/207.1 |
| 5,679,605 | * 10/1997 | Brennan et al. ...................... 438/626 |
| 5,780,874 | * 7/1998 | Kudo ..................................... 257/77 |
| 5,824,599 | * 10/1998 | Schacham-Diamand et al. .. 438/678 |
| 5,851,913 | * 12/1998 | Brennan et al. ...................... 438/622 |
| 5,866,484 | * 2/1999 | Muto ................................... 438/738 |
| 5,877,557 | * 3/1999 | Zawaideh ............................ 257/748 |
| 5,886,867 | * 3/1999 | Chivukula et al. .................. 361/311 |
| 5,891,513 | * 4/1999 | Dubin et al. ........................... 427/98 |

(List continued on next page.)

FOREIGN PATENT DOCUMENTS 7-226387 * 8/1995 (JP) .............................. H01L/21/28

OTHER PUBLICATIONS

Strandjord et al., "MCM–LD: Large Area Processing Using Photosensitive BCB", IEEE Trans. Comp., Packg., and Manuf. Technol. B vol. 18, 1995, May 1995.*

Primary Examiner—Olik Chaudhuri
Assistant Examiner—Nathan W. Ha
(74) Attorney, Agent, or Firm—Dennison, Scheiner, Schultz & Wakeman

(57) ABSTRACT

A process for manufacturing an electronic interconnect structure, the process including the steps of depositing an adhesion metal layer over a dielectric material surface having at least one exposed aluminum surface; depositing a barrier metal layer over the adhesion metal layer; depositing a first layer of aluminum over the barrier metal layer; depositing an intermediate barrier metal layer over the first layer of aluminum; applying a photoresist layer on top of the intermediate barrier metal layer; exposing and developing the photoresist layer; removing the exposed barrier metal and photoresist layer, leaving a layer of barrier metal over the aluminum layer; converting those portions of the layer of aluminum which are not covered by barrier metal to a porous aluminum oxide by porous anodization; removing the porous aluminum oxide; and removing the exposed barrier metal and adhesion metal layers to leave exposed patterned aluminum, and an electronic interconnect structure manufactured by this method.

9 Claims, 8 Drawing Sheets

U.S. PATENT DOCUMENTS

| | | | |
|---|---|---|---|
| 5,904,557 | * | 5/1999 | Komiya et al. .................... 438/633 |
| 5,946,600 | * | 8/1999 | Hurwitz et al. .................... 438/688 |
| 5,946,799 | * | 9/1999 | Yamamoto et al. .................... 29/852 |
| 5,950,102 | * | 9/1999 | Lee .................... 438/619 |
| 6,028,359 | * | 2/2000 | Merchant et al. .................... 257/750 |
| 6,046,099 | * | 4/2000 | Cadien et al. .................... 438/622 |
| 6,048,786 | * | 4/2000 | Kudo .................... 438/622 |
| 6,048,788 | * | 4/2000 | Huang et al. .................... 438/629 |

* cited by examiner

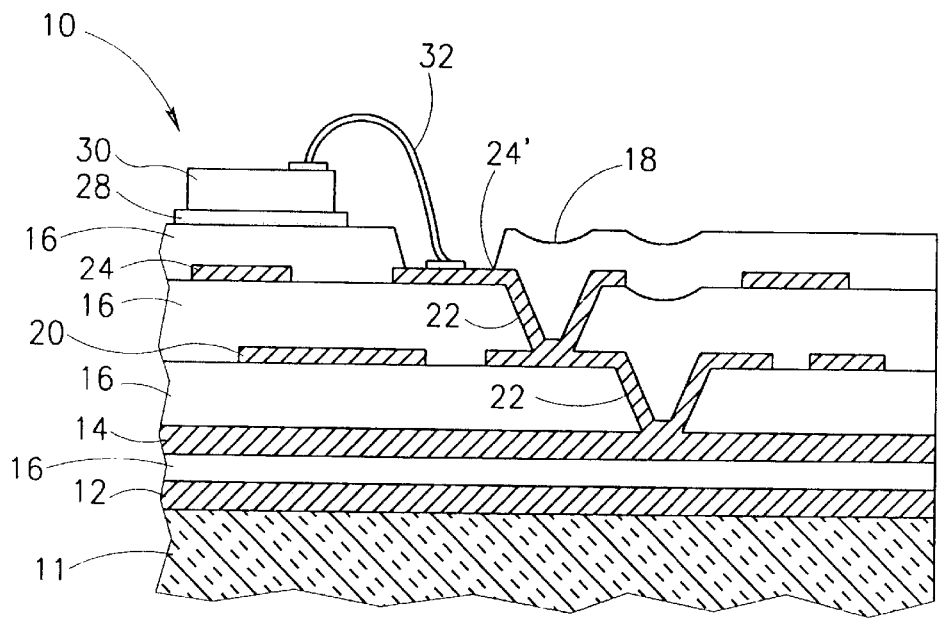
FIG. 1
PRIOR ART
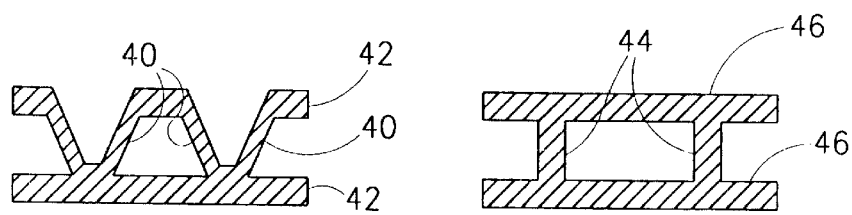
FIG. 2A
PRIOR ART
FIG. 2B
PRIOR ART
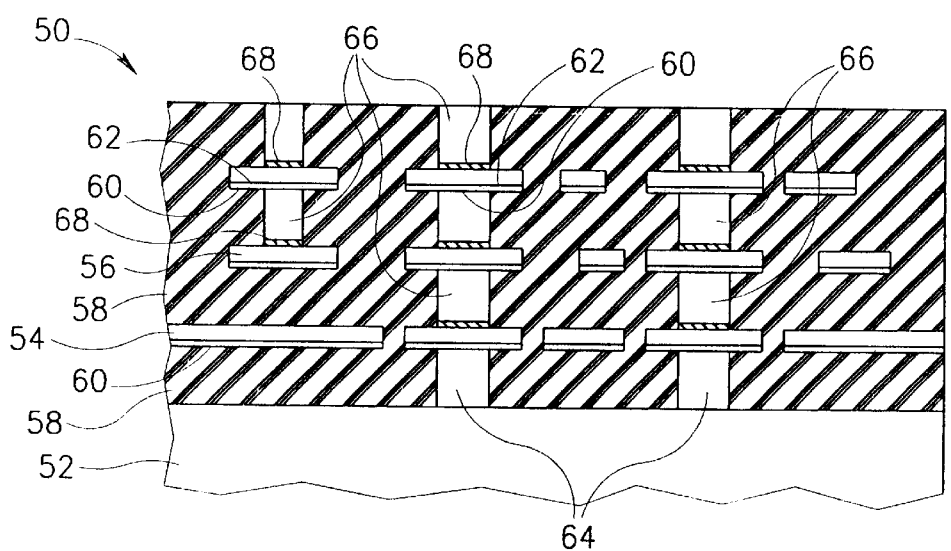
FIG. 3

ELECTRONIC INTERCONNECT STRUCTURE AND METHOD FOR MANUFACTURING IT

This application is a division of application Ser. No. 08/835,514 filed Apr. 8, 1997, now U.S. Pat. No. 5,946,600.

FIELD OF THE INVENTION

The present invention relates to a process for manufacturing a multilevel electronic interconnect structure having conductors in multiple layers separated by suitable insulating dielectric materials with vias for interconnection between layers, and an electronic interconnect structure formed by this process.

BACKGROUND OF THE INVENTION

Multilevel electronic interconnect structures for a variety of applications, particularly for forming integrated circuit chips, are well known in the art. These interconnect structures generally include several layers of conductors arranged in a predefined pattern separated by suitable insulating materials with vias for interconnection between layers. These structures may be used for manufacturing multi-or single chip module substrates, microelectronic passive devices (inductors, capacitors or combined circuitry) and interlevel structures for integrated circuits. Many electronic systems in fields such as the military, avionics, automotive, telecommunications, computers and portable electronics utilize components containing such structures.

One important use for these interconnect structures is Multi Chip Modules (MCM). The most advanced type of MCM technology is the so-called MCM-D technology, which provides modules whose interconnections are formed by the thin film deposition of metals on deposited dielectrics, which may be polymers or inorganic dielectrics. Using conventional fabrication techniques, MCMs can be produced having lines and spaces as thin as 10 μm with vias down to 20 μm in diameter. This MCM-D technology is unique because it achieves much higher interconnection density than other technologies. With the increase in density come equivalent improvements in signal propagation speed and overall device weight unmatched by other conventional means.

A schematic cross-section of a conventional MCM-D, indicated by reference numeral 10, is shown in FIG. 1. MCM 10 includes a base 11, generally formed of a dielectric material, a first metal layer 12 which serves as ground, a second metal layer 14 which serves to provide power to the MCM, and a layer of dielectric material 16, separating first metal layer 12 from second metal layer 14. MCM 10 includes two layers of conductors, 20 and 24, connected to metal layers 12 and 14, and connected to one another by vias 22. Dielectric material 16 separates the various metal elements.

A single chip 30 is shown affixed, by means of chip adhesive 28, to the upper surface of the multilevel interconnect structure thus formed. Chip 30 is coupled to a conductor 24' by a chip interconnect 32. It will be appreciated that in a complete MCM-D, a large number of layers of conductors coupled by vias are provided, and a large number of chips 30 are coupled to the multilevel interconnect portion of the module. Alternatively, chips can be placed in wells or openings in the surface of the interconnection layers to lower the thickness of the total package.

A number of techniques are known for producing electronic interconnect vias in MCM-D structures. According to one process, a dielectric material, generally ceramic or silicon coated with silicon dioxide, is provided as a base. Conductors are formed on the base beneath the dielectric material. A hole is formed in the dielectric material, which is then sputtered and pattern plated with a metal, such as copper, to interconnect the lower level of conductor 42 with a formed upper level 42. The vias 40 formed in this manner are known as unfilled vias, since the metal does not fill the entire hole, as shown in FIG. 2a. As can be seen in FIG. 1, the upper surface of dielectric material 18 above the unfilled vias is not planar. This is due to settling of the dielectric material in vias 22. In this case, the non-planar surface will reduce the conductors' density on the upper metal layer 42 and the unfilled via will decrease the via capability to remove heat generated by the chip.

According to another process, a thick photoresist layer is applied on top of the lower conductor level 46, as shown in FIG. 2b. The photoresist is patterned to define the vias, and metal, such as copper, is plated up 44. Photoresist is removed and polymer dielectric material is applied to cover conductors and vias. In the next step, the polymer is removed to expose the plated via and upper conductor level is applied 46. The vias 44 formed in this manner are known as filled vias, as shown in FIG. 2b. While filled vias are more desirable from a thermal and electrical point of view than unfilled vias, this process is complicated and expensive. This pattern plating process uses a thick layer of expensive photoresist, or an expensive photosensitive dielectric, and usually results in variation in the deposited metal thickness across the substrate. In this case, a non-masking dry etch back process to remove the polymer and expose the filled vias might not be applicable and additional steps, such as hard or soft mask etching processes or chemical mechanical polishing (CMP) may be required. This increases the number of process steps, and the equipment cost, and reduces the ability to process large area panels.

Yet another process is described in U.S. Pat. No. 5,580,825 to Labunov, et al. This process utilizes aluminum for the conductors and vias, and aluminum oxide as the dielectric material. The process includes defining level conductive paths by forming a blocking mask on the main aluminum layer, the blocking mask leaving exposed areas corresponding to the level conductive paths, carrying out a barrier anodization process on the main aluminum layer to form a surface barrier oxide over the level conductive paths, removing the blocking mask, providing an upper aluminum layer over the main aluminum layer, defining interlevel interconnections by forming a blocking mask on the upper aluminum layer, the blocking mask covering areas corresponding to the interlevel interconnections, and subjecting the main and upper aluminum layers to porous anodization. The barrier oxide defining the level conductive paths provides reliable masking of the level conductive paths during porous anodization. The porous aluminum oxide provides intralevel insulation between level conductive paths, and the combination of the barrier oxide and porous oxide provides reliable interlevel insulation between level conductive paths. The vias formed by this method are filled and the process results in a high degree of planarization.

It has now been found that other dielectric materials provide better performance than aluminum oxide, and that it is possible to provide, at reasonable cost, planarized filled aluminum vias with substantially perpendicular side walls formed by an overall environmentally friendly process. This provides an electronic interconnect structure which is relatively straightforward and inexpensive to manufacture, and which has high density interconnectivity and permits a stacked vias configuration.

SUMMARY OF THE INVENTION

According to the present invention, there is provided a process for manufacturing an electronic interconnect structure, the process including the steps of depositing an adhesion metal layer over a dielectric material surface having at least one exposed aluminum surface; depositing a barrier metal layer over the adhesion metal layer; depositing a first layer of aluminum over the barrier metal layer; depositing an intermediate barrier metal layer over the first layer of aluminum; applying a photoresist layer on top of the intermediate barrier metal layer; exposing and developing the photoresist layer; removing the exposed barrier metal and photoresist layer, leaving a layer of barrier metal over the aluminum layer; converting those portions of the layer of aluminum which are not covered by barrier metal to a porous aluminum oxide by porous anodization; removing the porous aluminum oxide; and removing the exposed barrier metal and adhesion metal layers to leave exposed patterned aluminum.

According to a preferred embodiment of the invention, there is provided a process for manufacturing multilevel electronic interconnect structure having at least one aluminum conductor layer with a filled aluminum via layer on top, all surrounded by a non-aluminum oxide dielectric material, the process comprising the steps of:

a multilevel electronic interconnect structure having conductors in multiple layers separated by an insulating dielectric material with filled aluminum vias for interconnection between layers, the process including the steps of depositing an adhesion metal layer over a base material surface; depositing a barrier metal layer over the adhesion metal layer; depositing a first layer of aluminum over the barrier metal layer; depositing an intermediate barrier metal layer over the first layer of aluminum; applying a photoresist layer on top of the intermediate barrier metal layer; exposing the photoresist layer through a conductor mask and developing the photoresist layer; removing the exposed barrier metal and photoresist layer, leaving a layer of barrier metal over the aluminum layer; depositing a second layer of aluminum over the first layer of aluminum and the remaining barrier metal; depositing an upper layer of barrier metal over the second layer of aluminum; applying a photoresist layer on top of the upper layer of barrier metal; exposing the photoresist through a via mask and developing the photoresist; removing the exposed barrier metal and photoresist layer, leaving a layer of barrier metal over the aluminum layer; converting those portions of both layers of aluminum which are not covered by barrier metal to a porous aluminum oxide by porous anodization; removing the porous aluminum oxide; removing the exposed barrier metal and adhesion metal layers to leave exposed conductors and filled vias of aluminum; applying a dielectric material on top of the base material and aluminum conductors and vias; and removing the dielectric material to expose a top surface of the filled aluminum vias.

According to a preferred embodiment of the invention, the steps of depositing a first layer of aluminum through the step of removing the dielectric material are repeated until the desired number of layers is reached.

Further according to a preferred embodiment of the invention, the base material is an aluminum base preprocessed according to the following steps:

polishing an aluminum base and depositing a barrier metal layer thereon;

applying a photoresist layer on the barrier metal layer;

exposing the photoresist with a base via mask and developing the photoresist layer;

removing the exposed barrier metal and photoresist, leaving a layer of barrier metal over the vias;

converting a portion of the aluminum base layer which is not covered by barrier metal to a porous aluminum oxide by porous anodization to a predetermined depth;

removing the porous aluminum oxide;

a non-aluminum oxide dielectric material on top of the base material and aluminum vias; and removing the dielectric material and remaining barrier metal to expose the top surface of the filled aluminum vias.

Further according to a preferred embodiment of the invention, the base material is a printed wiring board (PWB) preprocessed according to the following steps:

manufacturing a multilayer conventional PWB to the stage where it has an external metal layer;

drilling the board for via connections;

plating and filling the holes with copper;

polishing copper extending from the vias;

patterning the external metal layer with photoresist and etching the external metal layer to create capture pads;

coating the PWB surface and copper capture pads with polymeric dielectric material; and removing the polymeric dielectric material until the capture pads are exposed.

There is further provided in accordance with the present invention a multilevel electronic interconnect structure including at least two layers of conductors on and separated by a non-aluminum oxide dielectric material, a layer of an adhesion metal on the dielectric material, beneath each conductor, a layer of a barrier metal selected from the group consisting of tantalum, niobium, hafnium, titanium, and zirconium between the adhesion metal layer and each conductor, filled aluminum vias interconnecting the layers of conductors, the filled aluminum vias being surrounded by the non-aluminum oxide dielectric material, and a layer of the barrier metal beneath each via, between the via and an interconnected conductor.

BRIEF DESCRIPTION OF THE DRAWINGS

The present invention will be further understood and appreciated from the following detailed description taken in conjunction with the drawings in which:

FIG. 1 is a schematic illustration of a prior art multi-chip module;

FIGS. 2a and 2b are schematic illustrations of unfilled and filled vias, respectively;

FIG. 3 is a schematic cross-section of a multilevel electronic interconnect constructed and operative in accordance with one embodiment of the present invention;

DETAILED DESCRIPTION OF THE INVENTION

Figure 4A:
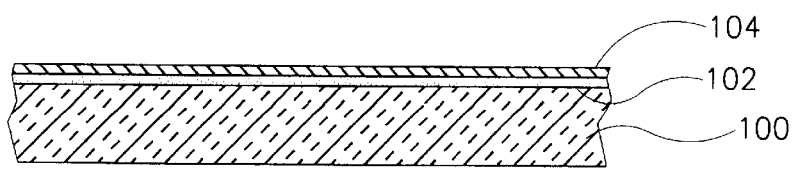
FIGS. 4a to 4k illustrate the steps in the process of forming a multilevel electronic interconnect in accordance with one embodiment of the present invention.

The present invention relates to a process for manufacturing an electronic interconnect structure and to a multi-level electronic interconnect structure prepared by the method having conductors in multiple layers separated by suitable insulating dielectric materials with filled aluminum vias for interconnection between layers. It is a particular feature of the invention that the interconnect structure includes filled vias of aluminum. Preferably, the exposed upper surface of the structure is substantially planar. According to a preferred embodiment, the insulating dielectric material is a polymeric material.

The structures of the invention offer very high density interconnectivity combined with reliable filled vias formed by an anodization process and surrounded by a very low dielectric constant insulator. Yet the structures have low weight, high thermal properties and low cost performance, and meet the performance requirements of high end electronic systems. The process of the invention has fewer process steps than conventional techniques (conductors and interconnect are generated in one step), the steps are simpler and more controllable, equipment cost and required space are reduced, and low cost performance can be achieved not only by the increased yield and low cost materials used, but also by the possibility of processing panels of relatively large area using a fully automated process.

The basic steps of the method are as follows. An adhesion metal layer is deposited over a dielectric material surface having at least one exposed aluminum surface. A barrier metal layer is deposited over the adhesion metal layer. A layer of aluminum is deposited over the barrier metal layer. A second barrier metal layer is deposited over the layer of aluminum. A photoresist layer is deposited on top of the second barrier metal layer. The photoresist layer is exposed and developed. The exposed barrier metal and photoresist layer are removed, leaving a layer of barrier metal over the aluminum layer. Those portions of the layer of aluminum which are not covered by barrier metal are converted to a porous aluminum oxide by porous anodization, and the porous aluminum oxide is removed. The exposed barrier metal and adhesion metal layers are removed, to leave exposed patterned aluminum. A non-aluminum oxide dielectric material is applied about the dielectric material surface and patterned aluminum, and the dielectric material is removed to expose portions of the patterned aluminum. It will be appreciated that the size and shape of the aluminum features are limited only by standard thin photoresist resolution and simple anodization process control. Furthermore, very low thickness variation between the filled vias permit the interconnect to be used as electrodes to connect finer pitch components.

Referring now to FIG. 3, there is shown a multilevel electronic interconnect structure 50 constructed and operative in accordance with one embodiment of the invention and including a base 52. Base 52 can be formed of any conventional base material, such as glass, ceramic, silicon coated silicon dioxide. According to a preferred embodiment, described in detail below, base 52 includes a preprocessed aluminum base. According to another preferred embodiment, also described in detail below, base 52 includes a printed wiring board.

At least two layers 54, 56 of conductors, separated by a non-aluminum oxide dielectric material 58 are formed on the surface of base 52. A layer 60 of adhesion metal, preferably titanium, is provided beneath each conductor 54, 56. The adhesion metal layer serves to improve the adhesion between the aluminum conductor and the dielectric beneath it, while not interfering with the conductivity of the vias and conductors.

A layer of a barrier metal 62, a metal which, during anodal polarization, forms a defensive film of oxide with a high resistance to oxidation, is provided between the titanium layer 60 and each conductor 54, 56. Barrier metal 62 is preferably selected from the group consisting of tantalum, niobium, hafnium, titanium, and zirconium, and most preferably is tantalum. This barrier oxide layer does not penetrate through the whole depth of the metal, thereby providing a reliable supply of anodizing voltage to all regions of the aluminum layer deposited on top. It is also a particular feature of the invention that the barrier metal provides protection against anodization to the aluminum underneath it while providing good conductivity between vias and conductors.

Filled aluminum vias 64 interconnect base material 52 and one layer 54 of conductors, and filled aluminum vias 66 interconnect the layers 54, 56, and 62 of conductors. It is a particular feature of the invention that the filled vias are formed of aluminum and have side walls substantially perpendicular to the conductors 54, 56, and 62. It is a further feature that the via size and shape are limited only by standard thin photoresist resolution and simple anodization process control. A layer 68 of a barrier metal, as defined above, is provided on top of each via 66 and 68, between the via and an interconnected conductor 54, 56 and 62, respectively. As can be seen in FIG. 3, multilevel electronic interconnect structure 50 has an almost completely planar upper surface.

With reference to FIGS. 4a to 4k, the process for preparing a multilevel interconnect according to one embodiment of the invention will be described. An adhesion layer 102 is deposited on a base material 100. A first barrier metal layer 104 is deposited on the adhesion metal layer 102. (FIG. 4a). Adhesion layer 102 and barrier metal layer 104 are preferably deposited by vacuum deposition techniques. The preferred adhesion metal is titanium and deposition thickness preferably ranges from 300 Å to 700 Å.

Figure 4B:
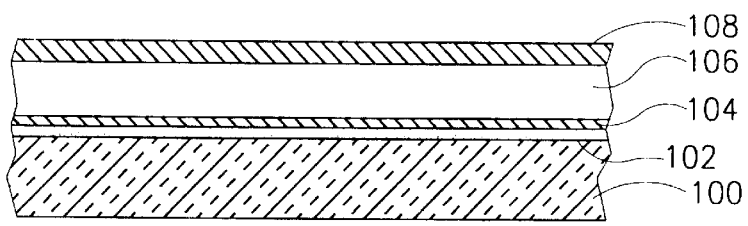

A first aluminum layer 106 is deposited on first barrier metal layer 104, and a second barrier metal layer 108 is deposited on the first aluminum layer 106. (FIG. 4b.) First aluminum layer 106 preferably has a thickness between about 1 $\mu$m to 5 $\mu$m, and can serve as the power or signal layer. Second barrier metal layer 108 serves only as an "anodization resist layer" which maintains the aluminum under it unconverted during the porous anodization step, as described below.

According to a preferred embodiment, the barrier metal in first barrier metal layer 104 and second barrier metal layer 108 are identical, tantalum being the most preferred barrier metal.

Figure 4C:
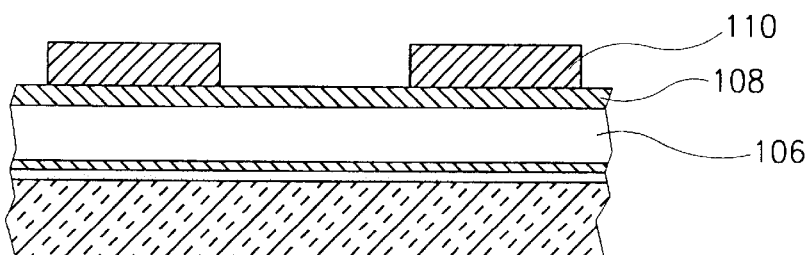
Figure 4D:
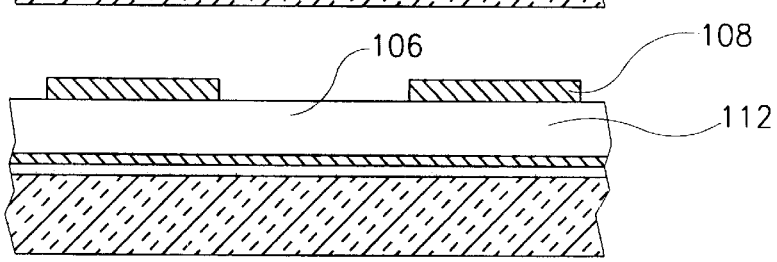

Photoresist 110 is applied on top of the second barrier metal layer 108, exposed through a conductor mask, and developed, as known. (FIG. 4c). This stage can be performed by any conventional photolithographical method, such as spin expose and develop high resolution positive (or negative) photoresist. The exposed barrier metal in layer 108 is removed, as by a dry etch RF plasma etcher or reactive ion etch process. These processes etch selectively the barrier layer with respect to the photoresist and aluminum layers. Finally, the photoresist 110 is stripped, leaving only the aluminum layer 112 covered by the barrier metal patterned in accordance with the image of the conductors (FIG. 4*d*). The structure is now ready for the deposition of the next aluminum layer, which will serve as the filled via layer.

Figure 4E:
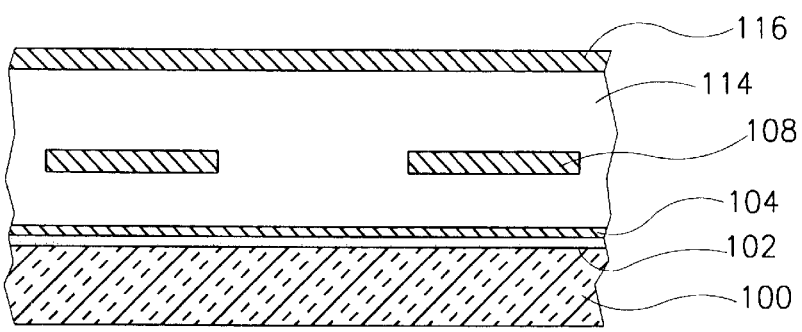
Figure 4F:
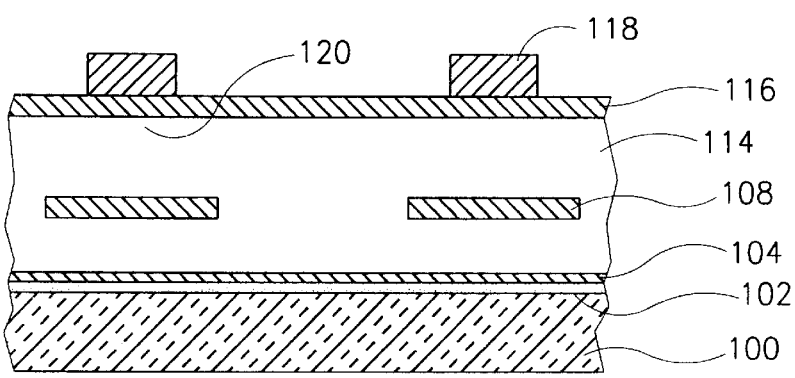
Figure 4G:
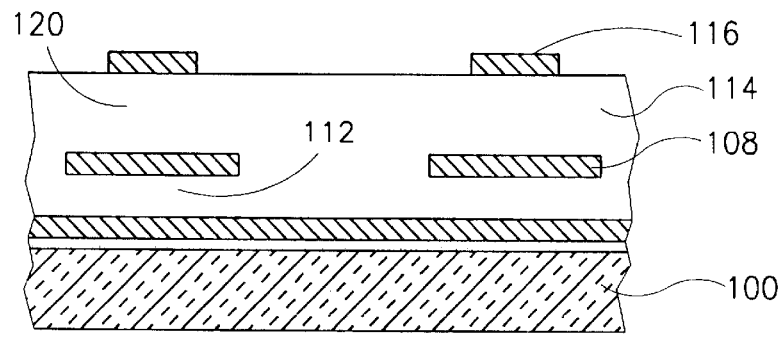

The steps involved in creating this layer are described in FIGS. 4*e* to 4*g*. The techniques employed are substantially identical to those described for creating the first aluminum and barrier layers. A second layer of aluminum 114 is deposited followed, once again, by a barrier metal layer 116 (FIG. 4*e*). Second aluminum layer 114 is preferably about 3 $\mu$m to 10 $\mu$m thick, thicker than first aluminum layer 106. This serves to ensure proper electrical performance (i.e., impedance) of the conductors located on the different levels within the finished structure.

Photoresist 118 is applied on top of barrier metal layer 116, exposed through a via mask, and developed, as known (FIG. 4*f*). As before, the exposed barrier metal in layer 116 is removed and the photoresist 118 is stripped, leaving only aluminum layer 120 covered by barrier metal (FIG. 4*g*).

Figure 4H:
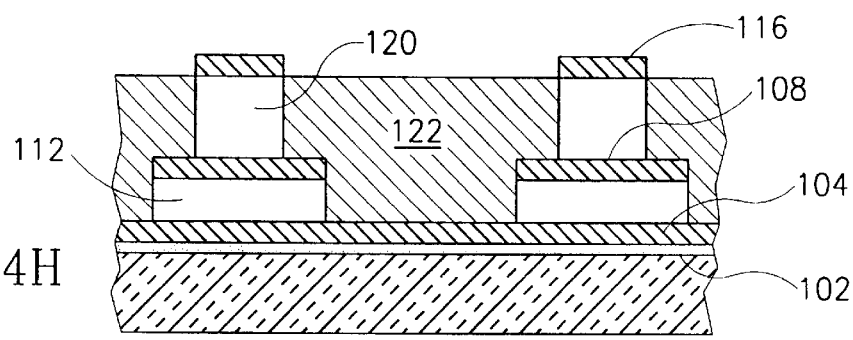

The structure now undergoes a porous anodization process which converts the aluminum which is not protected by a layer of barrier metal into a porous aluminum oxide 122. The barrier metal layers on top of selected portions of the first and second aluminum layers (i.e., the patterned conductors and vias), provide reliable masking of the interlevel connection lines during porous anodization. The porous anodization process continues through both aluminum layers, leaving unanodized aluminum under the barrier metal layers, and insulating the patterned conductors and vias with aluminum oxide 122. In this way, both the aluminum conductors 112 and the aluminum vias 120 are formed in a single step (FIG. 4*h*).

The preferred porous anodization process parameters are given in the following Table 1.

TABLE 1

Porous Anodization Parameters

Solution: Oxalic Acid dehydrate - 40 gr/lit. D.I. Water.
Cathode - SS 316
Anode - Fixtured substrate
Working parameters:

| | Range |
| --- | --- |
| Temperature | 22° C.–26° C. |
| Voltage | 40-55 V |
| Current density (start point) | 0.8–1.2 mA/cm² |

The anodization process starts by increasing the voltage supply from 0 to the preset value (between about 40 and 55V) with constant gradient of 1 to 2 V/sec. Once the preset voltage has been reached, the chosen voltage is kept constant and the current decreases throughout the process. When the formed anodized layer reaches a barrier layer, this layer will be only partially oxidized, thereby keeping the aluminum layer beneath it unconverted. In this way, the top barrier layer will create filled vias and the intermediate barrier layer will create conductors. It will be appreciated that, in the case where a single aluminum layer of conductors is processed at a time, only the single layer is anodized.

The first barrier metal layer 104 coupled to the adhesion layer 102 serves as a current supply layer necessary for the completion of the anodization process while the exposed aluminum layer becomes very thin. When the anodization reaches the bottom barrier layer, the current will drop sharply. At this residual current, the process should be continued for additional 40% to 50% of the total process time length. The reason for keeping the anodization at residual current for that amount of time is to create almost straight side walls of the filled vias and conductors. In this case, the width of the created conductors and vias will be almost identical to those appearing on the lithographic mask. In high density interconnective structures, this will result in higher yields and improved electrical performance.

Figure 4I:
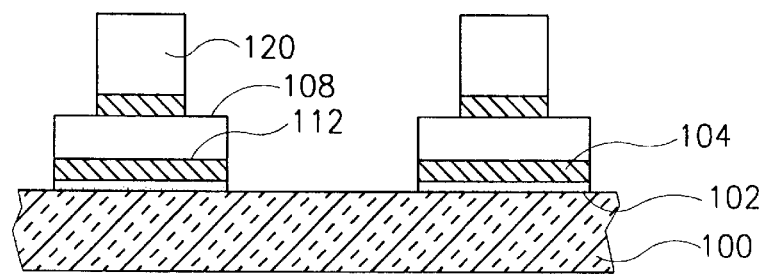

After completion of the anodization and when the required aspect ratio has been achieved, the aluminum oxide film 122 is removed completely, as shown in FIG. 4*i*. Preferably this is carried out using the solution and parameters set forth in Table 2. It is a particular feature of this solution that it is 100% selective to aluminum, thereby leaving the conductors and vias unetched. Proper agitation and other means might be required in small line spaces in order to remove oxide residues.

TABLE 2

| ALUMINIUM OXIDE ETCH PROCESS | | |
| --- | --- | --- |
| Solution: | Chromium oxide CrO₃ anhydrous | 20 gr/lit |
| | Phosphoric Acid: H₃PO₄ conc. (85%) | 35 ml/lit |
| | D.I. Water | |
| Temperature | 75° C.–85° C. | |

It will be appreciated by those skilled in the art that the pores of the aluminum oxide film generally proceed perpendicularly to the surface of the aluminum structure. The anodization process goes very deep into the aluminum since the anodization solution can penetrate through these pores down to the unanodized aluminum surface. In addition, the existence of these pores makes it possible to etch the anodized film very quickly.

Next, the exposed barrier metal 104, 108, 116 and adhesion metal 102 between the conductors 112 are removed, as by dry etching (FIG. 4*i*). The result is an aluminum conductor layer with aluminum columns on top to be used as filled vias or pads for the next interconnect level.

Figure 4J:
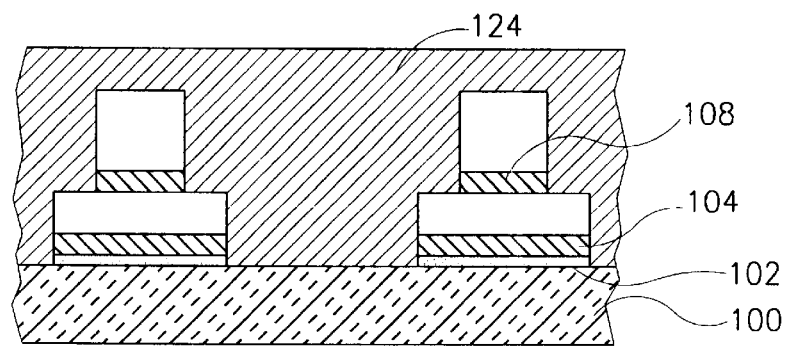

A non-aluminum oxide dielectric material 124 is now applied on top of the base material 100, to be used as the insulator between the created aluminum conductors 112 and vias 120 (FIG. 4*j*). The preferred thin film dielectric material has the following characteristics:

Low dielectric constant.

Thermal stability in excess of subsequent process or repair steps.

Good adhesion to substrate, conductors and self.

Low water absorption.

Good planarization.

Low stress formation.

Easy to process.

Spin coatable, pinhole-free and etchable.

Good mechanical properties.

Preferably, the dielectric material is a polymeric dielectric material. Polymers which are particularly suitable in the present invention are polyimides (such as the Pyraline series manufactured by DuPont Electronic Materials, USA) and benzocyclobutane (BCB) (such as the Cyclotenee™ series, manufactured by Dow Chemicals).

At this stage, the dielectric material is removed, such as by dry etch back, until the vias are exposed, as seen in FIG.

4k. It should be noted that the selection of dielectric with a good degree of planarization will simplify the etch back process of the dielectric material.

In the event that a dielectric with a relatively low degree of planarization is utilized, additional and alternative process steps, such as chemical mechanical polishing (CMP), or etch back through a hard or a soft mask, as known, can be used in order to remove the dielectric, thereby to expose the levelled and filled aluminum vias for the next deposition and lithographic steps.

Figure 4K:
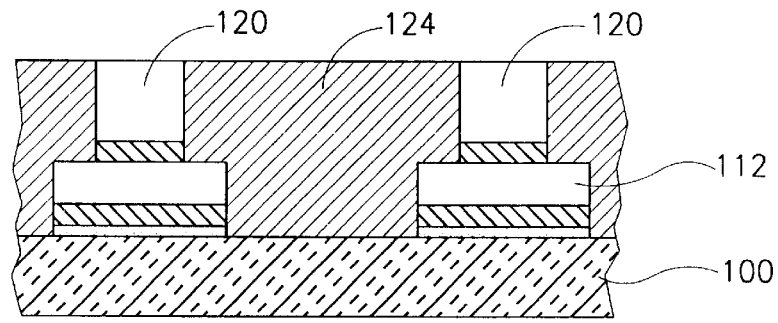

Once the structure shown in FIG. 4k is achieved, the steps described in FIGS. 4a to 4k are repeated until the required number of layers in the structure are achieved. Typically, up to five conductor layers are provided, where the uppermost layer may be a "pads only" aluminum layer created by using a "pads only" mask instead of the via mask. It will be appreciated that the uppermost conductor layer alternatively may be formed as a single layer. Therefore, the porous anodization step is performed on a single layer of patterned aluminum. In addition, in order to utilize the structure, typically it is desired to leave exposed pads of aluminum (not merely the top surface of the patterned aluminum). Accordingly, in this case, the process will be completed in one of the following ways, depending upon the design of the layer. If the layer is a "pads only" layer, without conductors, the final process step is the etching away of the porous aluminum oxide, which leaves the pads exposed. On the other hand, if the layer includes both conductors and pads, after etching away of the porous aluminum oxide, a photosensitive dielectric polymer is applied over the conductors and pads and the dielectric polymer is selectively removed to leave exposed only pads of aluminum.

It will be appreciated that deposition of each of the electric conductive materials described, such as titanium, tantalum and aluminum, can be performed by any conventional vacuum deposition technique, such as E-GUN evaporation or sputtering.

The process of the present invention has several advantages relative to conventional interconnect structure manufacturing techniques. In conventional structures having unfilled vias, the vias must be staggered in successive levels during the thin film fabrication, thereby consuming wiring channels. The filled vias created by the present invention permit the stacking of successive via levels. From an electrical design point of view, filled vias are ideal since they impose the least number of restrictions during the wiring lay-out.

In addition, there is a significant enhancement of the power distribution system. The power paths associated with stacked vias are less inductive, and therefore are able to support increased switching activities. Also the voltage drop for each via structure is reduced, providing better electrical interconnection to a chip. Furthermore, the filled planar vias interconnection can be used as electrodes to connect chip scale packages (CSP's), which have fine pitch array electrodes.

The filled via interconnection method of the invention obtains finer interconnections relative to other via formation techniques utilizing photosensitive dielectric polymers because the filled vias are formed by an anodization process using photoresist which has excellent resolution relative to the photosensitive dielectric resins used in conventional filled and unfilled via formation techniques. In addition, the anodization process permits very tight control with respect to the via shape. Using the process of the invention, vias and sidewalls of the conductors are substantially perpendicular to the surface layer. Also, it should be noted that resins which are not conventionally used but which have good performance characteristics, such as heat resistance, dielectric properties, and cost, can be used as the dielectric film material, since photolithography of the dielectric film is not required.

Finally, since there is no pattern plating process involved, good thickness uniformity of vias across the structure is achieved. This enables production of a very planar dielectric surface containing embedded top exposed filled vias or pads. The planarized surface increases the yield of the next lithographic step and the filled vias increase the reliability of small size interconnects. Furthermore, replacing the plating process with vacuum deposition and anodization processes to create conductors and vias reduces the overall amount of environmentally harmful chemicals.

Figure 5:
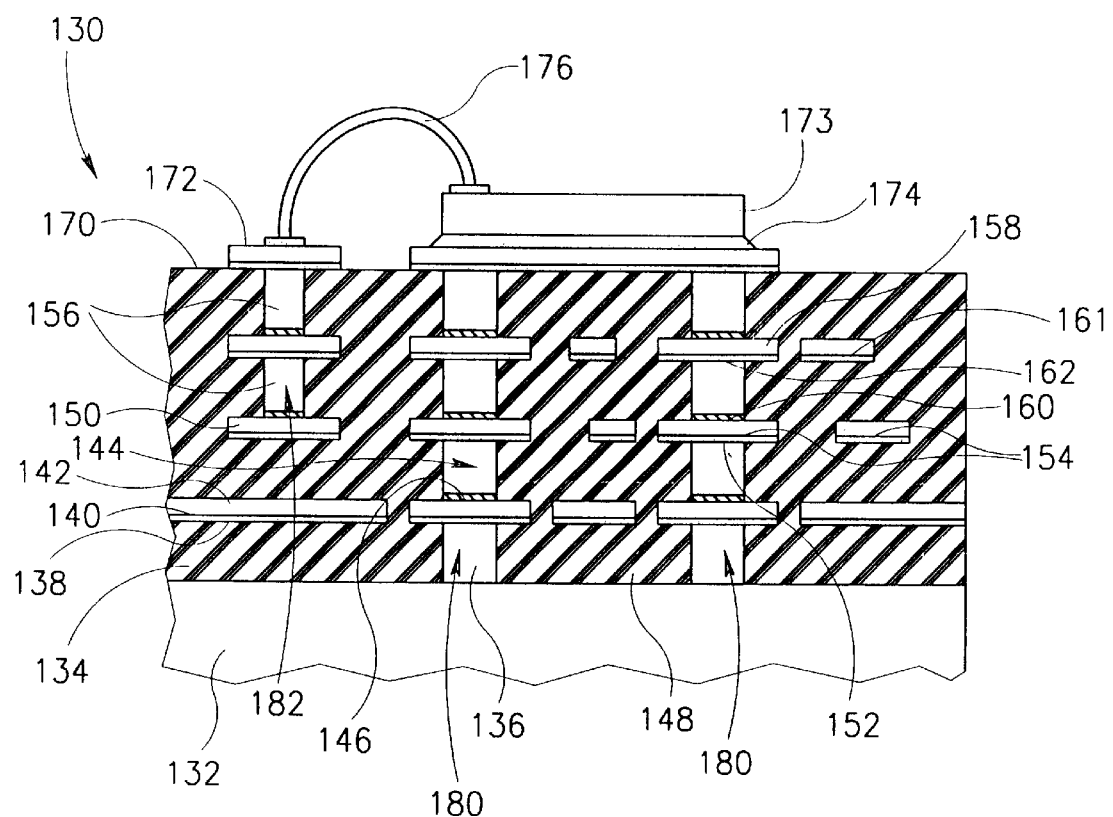
FIG. 5 is a schematic cross-section of a Multi Chip Module (MCM-D) constructed and operative in accordance with one embodiment of the present invention.

Referring now to FIG. 5, there is shown a schematic cross-section of a Multi Chip Module, type D (MCM-D) 130 constructed and operative in accordance with one embodiment of the present invention. MCM-D 130 includes an aluminum base 132 preprocessed in accordance with one preferred embodiment of the invention, which is described hereinbelow. Aluminum base 132 includes a planar layer of a polymeric dielectric material 134, as defined hereinabove, and a plurality of filled aluminum vias 136 exposed on the surface. Aluminum base 132 serves as the ground layer for the MCM-D.

On aluminum base 132 is deposited an adhesion metal layer 138, preferably titanium. On adhesion metal layer 138 is deposited a first barrier metal layer 140, preferably tantalum. A first layer of aluminum conductors 142 is created on first barrier metal layer 140. First layer 142 serves to provide power to the module. A first layer of aluminum vias 144 is formed on the first layer of aluminum conductors 142, with an intermediate layer of barrier metal 146 therebetween. A polymeric dielectric material 148 surrounds and insulates aluminum vias 144 and conductors 142.

On polymeric dielectric material 148 and the surface of vias 144 a second layer of conductors 150 is formed. A second layer of adhesion metal 152 is deposited between polymeric dielectric material 148, vias 144, and conductors 150 on which a third layer of barrier metal 154 is deposited. Additional layers of vias 156 and conductors 158 are provided, with layers of barrier metal 160 beneath each via on top of a conductor, and layers of adhesion metal 162 and barrier metal 164 beneath each conductor and above dielectric material and vias. Conductor layers 150 and 158 serve as signal conductors for the module.

On the top planar surface 170 of the interconnect structure of MCM-D 130 is a pad layer of conductors 172 to which a plurality of chips 173 are affixed, as by chip adhesive 174. A chip interconnect 176 couples chip 173 to pad 172. In this embodiment, vias 180 serve as thermal vias, which provide for heat removal from the chip to the base of the structure, while vias 182 serve as logic vias.

Figure 6A:
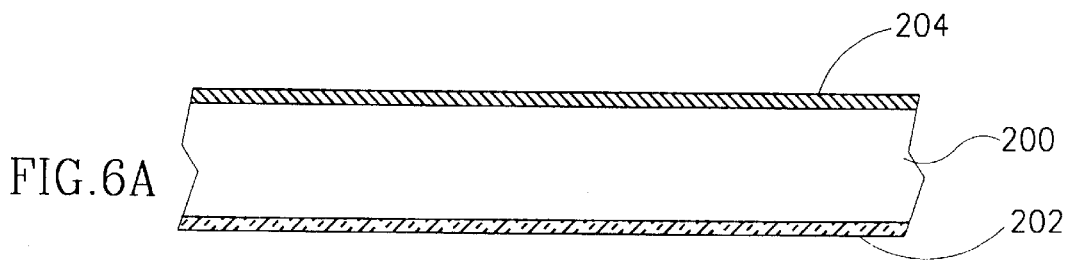
FIGS. 6a to 6f illustrate the steps in the process of preparing an aluminum base in accordance with one embodiment of the present invention.
Figure 6B:
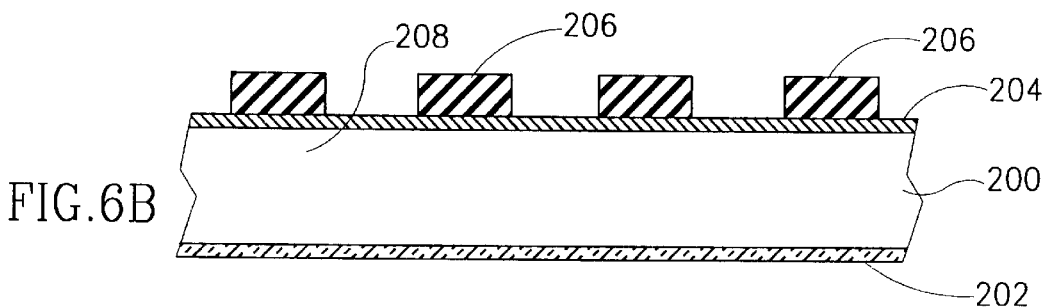
Figure 6C:
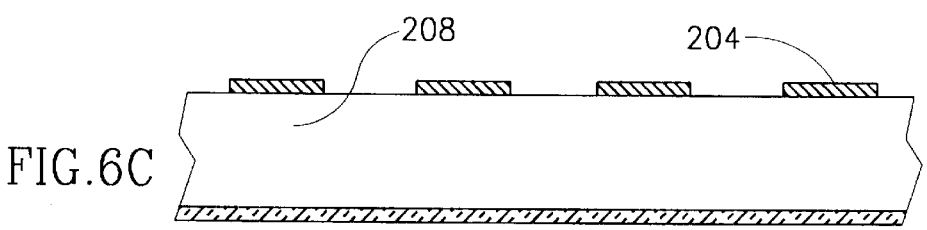

According to a preferred embodiment of the invention, the aluminum base is preprocessed according to the steps illustrated in FIGS. 6a to 6f. In this process, as seen in FIG. 6a, a polished aluminum alloy 200, protected by polymer 202 from one side, is deposited with a barrier metal 204 such as tantalum or titanium from the other side. The metal could be deposited by evaporation or sputtering to achieve a thickness ranging from 800 Å to 1000 Å. Next, photoresist material 206 is applied on top of the barrier metal 204 and vias 208 are patterned and developed (FIG. 6b). In the next step, FIG. 6c, the exposed barrier metal 204 is etched and photoresist is stripped.

Figure 6D:
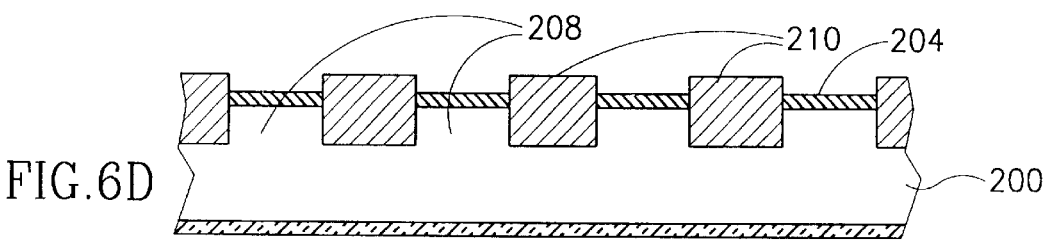

After this stage, the structure undergoes a porous anodization process(FIG. 6d). The preferred parameters of this base anodization process are described in Table 3.

TABLE 3

BASE ANODIZATION PROCESS

| Solution: | Oxalic Acid - 40 g/l ± 1 g/l |
| --- | --- |
| | Citric Acid - 20 g/l ± 1 g/l |
| | Boric Acid - 16 g/l ± 0.5 g/l |
| Cathode: | SS 316 |
| Anode: | fixtured substrate |
| Working parameters: | |
| | Range |
| Temperature | 19° C.–23° C. |
| Voltage | 0–150 V |
| Current density | 1.5–2.5 Amp/cm$^2$ |

Figure 6E:
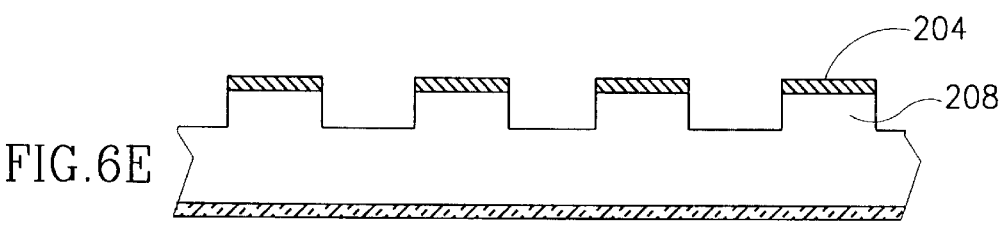
Figure 6F:
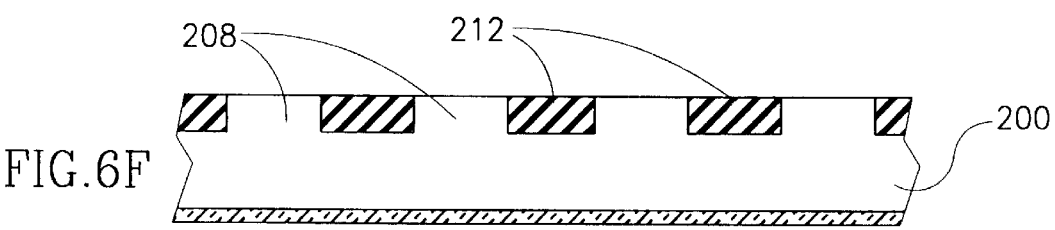

The voltage is progressively increased with constant gradient of 1 to 2 V/sec from 0 to the voltage generating the required current at which the anodization is performed. The process is maintained at constant current and the voltage increases as the anodization progresses. When the required anodization depth is achieved (usually 5 to 10 μm), the anodization process is stopped (FIG. 6d) and the porous aluminum oxide film 210 is selectively etched away with the solution described in Table 2 (FIG. 6e).

In the next step, a polymeric dielectric film 212 is applied covering vias 208, base 200 and barrier metal 204. The dielectric is then removed, thereby exposing the vias connected to the base aluminum material, FIG. 6f. Once the vias are exposed, the preparation of the base material is complete.

The use of an aluminum base prepared this way in an MCM-D structure, with filled aluminum vias running all the way from the surface of the structure to its base, will result in superior heat dissipation capacity which is advantageous because of the heat generated by semiconductor devices.

Figure 7:
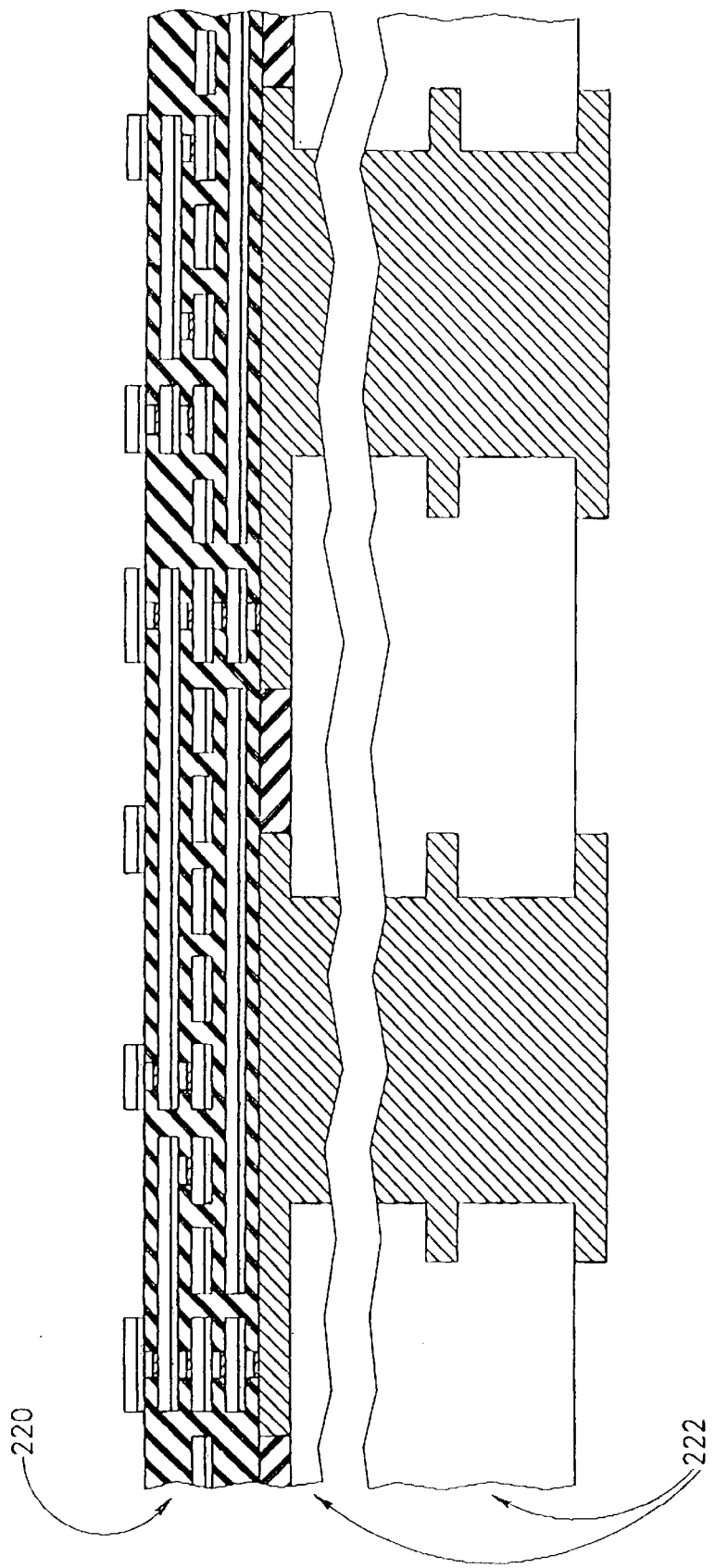
FIG. 7 is a schematic cross-section of a multilevel electronic interconnect structure constructed and operative in accordance with another embodiment of the present invention, including a printed wiring board base.

According to an alternative preferred embodiment of the invention, shown schematically in FIG. 7, the multilevel electronic interconnect structure of the invention can be used in a so-called "built-up circuit" 220, in which the base 222 is a printed wiring board. This embodiment is substantially identical to that of FIG. 3, with the exception of the base.

Figure 8A:
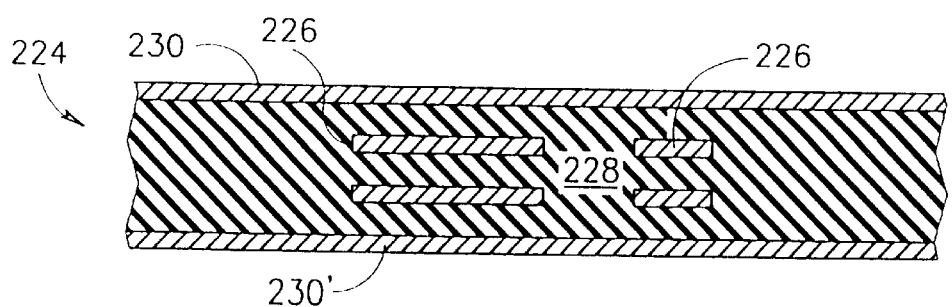
FIGS. 8a to 8f illustrate the steps in the process of preparing a printed wiring board base in accordance with one embodiment of the present invention.
Figure 8B:
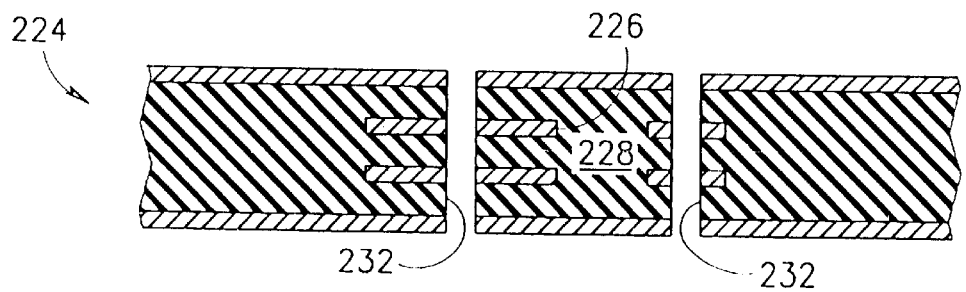

A printed wiring board (PWB) for use as a base material for an MCM-D construction can be prepared as follows, as shown in FIGS. 8a to 8f. A multilayer conventional PWB 224, including layers of conductors 226 surrounded by polymeric dielectric material 228, as known, is manufactured, using conventional manufacturing techniques, to the stage of external layer processing (FIG. 8a). At this stage, the board has two external metal layers 230 and 230' suitable for preparation as a smart base for a multilevel interconnect structure.

Figure 8C:
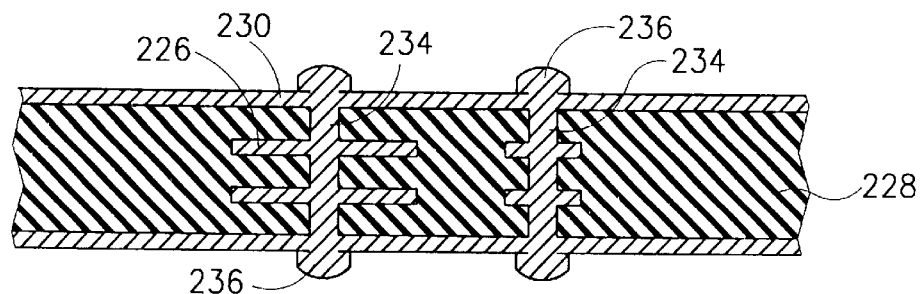
Figure 8D:
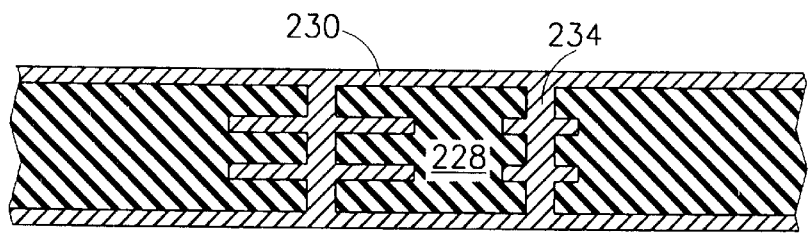
Figure 8E:
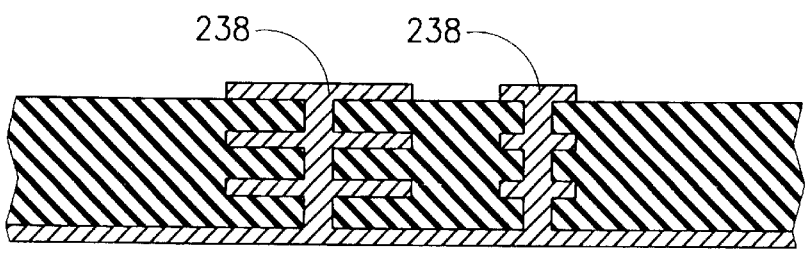
Figure 8F:
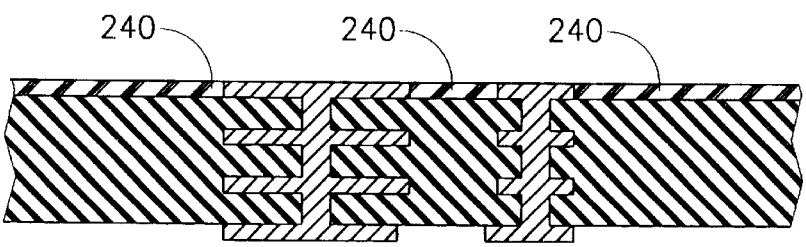

The board 224 is drilled for via connection (FIG. 8b) and the holes 232 are plated and filled with copper 234, as by a pattern plating process (FIG. 8c). Excess copper 236 extending from the vias is polished (FIG. 8d) and one external metal layer 230 is patterned with photoresist. The external metal layer 230 is etched to create so-called "capture pads" 238 (FIG. 8e). The surface of PWB 224 and copper capture pads 238 are coated with dielectric material 240, preferably polymeric dielectric material as described above, and this material is then etched back until the capture pads are exposed (FIG. 8f). At this stage, the PWB is ready to serve as a base for the process described in FIGS. 4a to 4k, and a first layer of titanium followed by a layer of tantalum followed by a first layer of aluminum conductors can be formed thereon.

When the desired number of thin film layers is achieved, the bottom full copper layer 230' may be processed, as described, to create one more set of thin film layers or it could be printed and etched in a conventional manner to create conductors and pads for a next package level.

It will be appreciated that the invention is not limited to what has been described hereinabove merely by way of example. Rather, the invention is limited solely by the claims which follow.

What is claimed is:

1. A multilevel electronic interconnect structure comprising:

a) at least two layers of aluminum conductors supported on a base and disposed on and separated by a non-aluminum oxide dielectric material;

b) a layer of an adhesion metal on said dielectric material, beneath each said conductor;

c) a layer of a barrier metal selected from the group consisting of tantalum, niobium, hafnium, titanium, and zirconium disposed between each said adhesion metal layer and each said conductor;

d) filled aluminum vias at least about 3 microns thick interconnecting adjacent layers of conductors, said filled aluminum vias being surrounded by said non-aluminum oxide dielectric material;

e) a layer of said barrier metal beneath each said via, disposed between said via and an interconnected conductor; and f) an external surface remote from the base, said external surface being constructed and arranged for receipt thereon of at least one integrated circuit chip, the electronic interconnect structure serving as means for interconnecting the at least one integrated circuit chip.

2. The multilevel electronic interconnect structure of claim 1, wherein said adhesion metal is titanium.

3. The multilevel electronic interconnect structure of claim 1, wherein said barrier metal is tantalum.

4. The multilevel electronic interconnect structure of claim 2, wherein said barrier metal is tantalum.

5. The multilevel electronic interconnect structure of claim 1, wherein said base includes a preprocessed aluminum base.

6. The multilevel electronic interconnect structure of claim 1, wherein said base includes a printed wiring board.

7. The multilevel electronic interconnect structure of claim 1, wherein said dielectric material includes a polymeric dielectric material.

8. The multilevel electronic interconnect structure of claim 7, wherein said dielectric material includes a polyimide.

9. The multilevel electronic interconnect structure of claim 7, wherein said dielectric material includes a benzocyclobutane.

* * * * *